United States Patent [19]

Ishii

[11] 4,163,264

[45] Jul. 31, 1979

[54] NOISE IMPROVEMENT BY CAPACITOR BANK IN MAGNETIC RECORDING AND PLAYBACK APPARATUS

[75] Inventor: Kazuo Ishii, Tokyo, Japan

[73] Assignee: Tokyo Shibaura Electric Co., Ltd., Kawasaki, Japan

[21] Appl. No.: 768,426

[22] Filed: Feb. 14, 1977

[30] Foreign Application Priority Data

Feb. 13, 1976 [JP] Japan .................................. 51-14567

[51] Int. Cl.$^2$ .......................... G11B 5/02; H03H 7/08
[52] U.S. Cl. ...................................... 360/68; 363/39; 363/47
[58] Field of Search ..................... 360/68, 67, 66, 137; 363/39, 44, 45, 46, 47, 48

[56] References Cited

U.S. PATENT DOCUMENTS

| | | | |
|---|---|---|---|
| 3,015,695 | 1/1962 | Claras | 360/68 |
| 3,838,452 | 9/1974 | Royce | 360/66 |
| 3,918,088 | 1/1975 | Tabuchi | 360/66 |
| 3,968,519 | 7/1976 | Yoneya | 360/68 |

OTHER PUBLICATIONS

"Reference Data for Radio Engineers"—Howard W. Sams & Co., N.Y. Sixth Edition, 1975 pp. 5-17ff.
*Standard Handbook for Electrical Engineers,* McGraw Hill Book Co., 10th Edition, 1974, pp. 4–124.
"Ham Radio" Article, Jun. 1975, pp. 26–31, by Harry Leeming, *Radio Frequency Interference, Cause & Care.*
Theory of Operation, Manual & Schematics, ©1975, ALTAIR Computer Power Supply.
Radio Amateur's Handbook, ©1975, p. 128, *Power Supplies.*

*Primary Examiner*—Jay P. Lucas
*Attorney, Agent, or Firm*—Oblon, Fisher, Spivak, McClelland & Maier

[57] ABSTRACT

A magnetic recording and playback apparatus adapted to decrease tape hiss noises, wherein an amplifier power supply circuit or an output circuit for coupling an output from a recording amplifier to a magnetic head is provided with a capacitor block whose internal loss decreases as frequency increases and consisting of a plurality of capacitors. The capacitor block is formed by connecting with an electrolytic capacitor of a large capacitance included in the power supply circuit or output circuit at least one nonpolarized capacitor having a smaller capacitance and smaller internal loss than the electrolytic capacitor.

9 Claims, 5 Drawing Figures

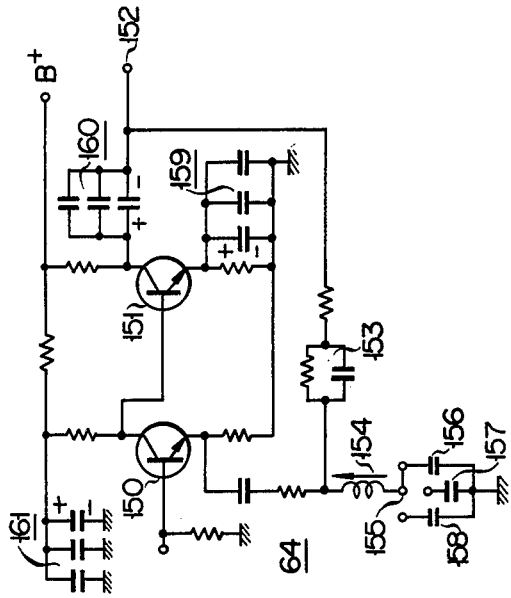
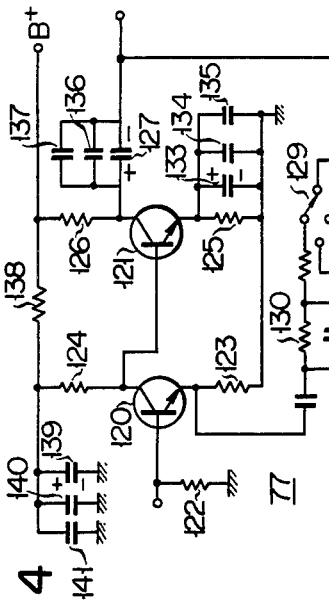
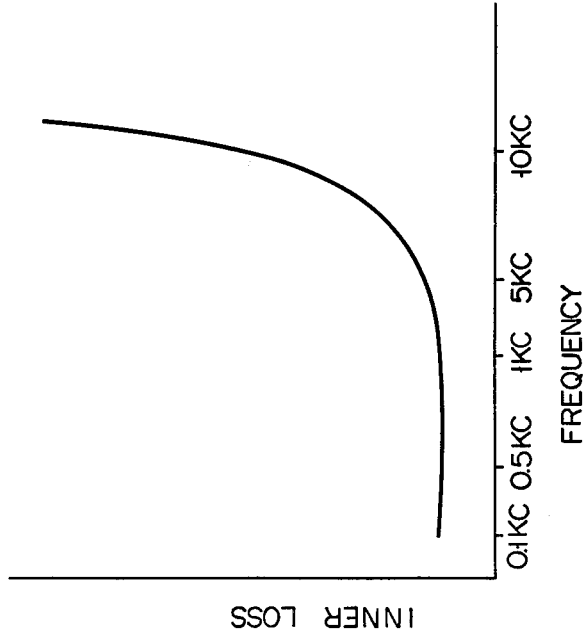

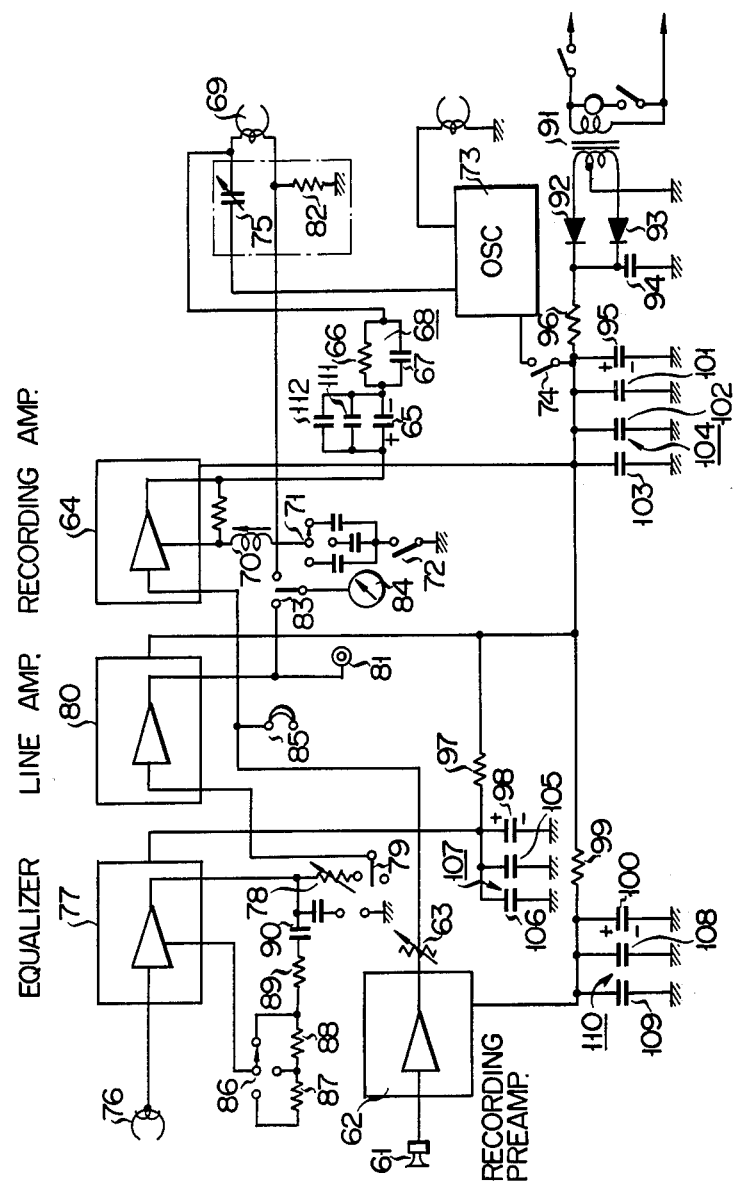
F I G. 3

NOISE IMPROVEMENT BY CAPACITOR BANK IN MAGNETIC RECORDING AND PLAYBACK APPARATUS

This invention relates to a magnetic recording and playback apparatus.

Tape hiss noises are cited as one of the factors which obstruct the high fidelity of an audio magnetic recording and playback apparatus. With a magnetic recording and playback apparatus which uses a tape having a broad track width and in which the tape is run at a high speed normally used as 38, 19 or 7.5 cm/sec, the tape hiss noises can be minimized to such extent as practically does not affect the hearing sense where the signal level is large. However, the lowest level of an audio signal capable of being recorded on a magnetic tape is affected by tape hiss noises, thereby narrowing a dynamic range.

With a magnetic recording and playback apparatus such as a cassette deck in which the tape is run at a speed of 4.8 cm/sec and in which the track width is about 0.3 mm, tape hiss noises prominently obstruct the hearing sense, even if a tape material used is as free from noises as possible.

The known methods for decreasing tape hiss noises include the so-called Dolby system and dbx system. With the Dolby system, a signal in a preselected frequency range (higher than hundreds of hertzs) at which particularly tape hiss noises are ready to be felt by the ears is compressed for recording by a compressor circuit according to an amplitude level and expanded for playback by an expander circuit. With this Dolby system, input levels to the compression circuit and expansion circuit should always be equal. Therefore, the Dolby system has the drawbacks that deterioration of sound quality is likely to arise due to different tape sensitivities, and difficulties are presented in rendering dolbyized decks interchangeable with each other. Namely, when reproduction is made by separate dolbyized decks from a tape on which musical information is recorded by the Dolby system, then reproduced sound quality possibly varies from deck to deck.

As compared with the Dolby system, the dbx system enables audio signals to be compressed and expanded to a larger degree, thereby more effectively suppressing tape hiss noises. Yet, the dbx system has the drawback that since a compression amplifier and expansion amplifier are used, considerable fluctuations appear in a signal level, in case tape sensitivity changes due to, for example, the extension of a tape during recording or reproduction, and, the tape-running mechanism should be considerably stabilized. Moreover, the above-mentioned compression amplifier and expansion amplifier are very expensive.

It is well known that when amplified by an amplifier, an audio signal is subject to various distortions. A nonlinear distortion resulting from the amplification characteristic of an active device such as a vacuum tube or transistor can generally be suppressed to a low level, little tending noticeably to obstruct the fidelity of musical sounds reproduced. According to the present inventor's experiments it has been found that the fidelity of musical sounds reproduced is considerably impaired by harmonic components generated by a slight nonlinear characteristic of a passive element such as a resistor, capacitor or diode used in an audio amplifier while an audio signal passes therethrough and distortion components resulting from their intermodulations.

A capacitor most considerably obstructs the fidelity of musical sounds reproduced among the passive elements. The following Table sets forth values of distortions resulting from the nonlinear characteristic of passive elements such as a capacitor and resistor, as measured by a "Component; linearity measuring instrument" manufactured by CLTI.

Table

| Kind of capacitor | Value of third harmonic waves of 10 kH2 | Equivalent value (%) |
|---|---|---|
| Ceramic | −60 (dB) | 0.1 |
| Tantalum (sintered) | −60 | 0.1 |
| Chemical (Electrolytic) | −80 | 0.01 |
| Metalized paper | −100 | 0.001 |
| Lacker film | −120 | 0.0001 |
| Mylar | −140 | 0.00001 |
| Polypropylene | −155 | 0.00001 |
| Styrol | less than −160 | less than 0.00001 |
| Kind of resistors | | |
| Solid | −80 (dB) | 0.01 |
| Carbon film | −120 | 0.0001 |
| Wirewound | −120 | 0.0001 |
| Metal film | −140 | 0.00001 |

The above Table shows that an electrolytic capacitor, tantalum capacitor and ceramic capacitor particularly give rise to a large amount of noises or harmonic components. The noises caused by a resistor correspond to noises which are uniformly distributed over the entire audible frequency range.

FIG. 1 shows the internal loss of an electrolytic capacitor, a composition of an dielectric loss (tanδ) and electrode loss relative to the frequencies. As seen from this figure, the internal loss suddenly rises at high frequencies. The nonlinear internal loss of the electrolytic capacitor gives rise to a large amount of harmonic noises, seriously impairing the fidelity of musical sounds reproduced. An amplifier capable of decreasing such harmonic noises is disclosed in the copending application Ser. No. 629,233 (filed Nov. 6, 1975), Ser. No. 678,554 (filed Apr. 20, 1976) and Ser. No. 678,550 (filed Apr. 20, 1976) assigned to the same assignee as this application.

The present inventor has further discovered that with a magnetic recording and reproduction apparatus, harmonic noises generated in an amplifier are mixed with a high frequency bias signal of, for example, 100 kHz during recording to give rise to beat components or hiss noises over the entire audible frequency range and a frequency range above the entire audible frequency range, causing a dynamic range for recording to be remarkably reduced and deteriorating high fidelity reproduction of musical sounds.

When a tape is run rapidly, the greater part of beat components appears outside of the audible frequency range and/or a high audible frequency range to which the ears are not so sensitve and thus practically exerts less harmful effect on the hearing sense. However, with a magnetic recording and reproduction apparatus such as a cassette deck in which the tape speed is slow and the track width is narrow, beat components or hiss noises are strongly appeared in the anditory sense in the frequency range of 1000 to 4000 Hz to which the ears are most sensitive and considerably decrease the fidelity of reproduction of musical sounds. With a recording and reproduction amplifier, a low impedance output circuit and a power supply circuit through which large signal current flows most noticeably generate harmonic noises.

It is accordingly an object of this invention to provide a magnetic recording and playback apparatus enabling musical sounds to be recorded and reproduced with high fidelity.

Another object of the invention is to provide a magnetic recording and playback apparatus for a slow magnetic tape speed which can suppress tape hiss noises to a practically negligible level.

Still another object of the invention is to provide a magnetic recording and playback apparatus which can enlarge the recordable signal level range.

These objects can be attained by providing a power supply circuit or output circuit of a magnetic recording and reproduction apparatus with a capacitor block comprised of a plurality of capacitors connected in parallel with each other and whose internal loss decreases as frequency increases.

This invention can be more fully understood from the following detailed description when taken in conjunction with the accompanying, drawings in which:

FIG. 1 is a curve diagram showing the relationship between the internal loss of an electrolytic capacitor and the frequencies.

FIG. 3 is a circuit diagram of a magnetic recording and reproduction apparatus according to another embodiment of the invention;

FIG. 4 illustrates an equalizer circuit used in FIG. 3; and

Figure 2:
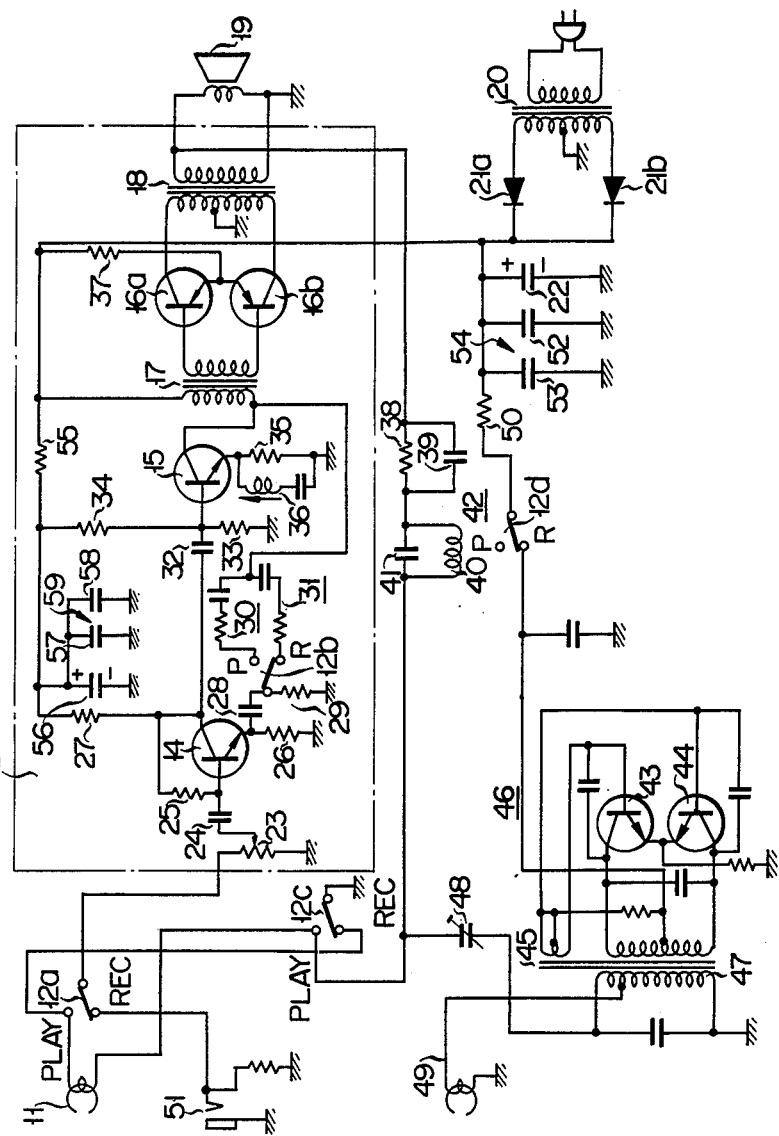
FIG. 2 is a circuit diagram of a magnetic recording and reproduction apparatus according to an embodiment of this invention.

FIG. 5 indicates a recording amplifier used in FIG. 3.

Referring to FIG. 2 showing a simplified magnetic recording and reproduction apparatus, an output signal from a magnetic head 11 used for both recording and reproduction is supplied to an amplifier 13 through a changeover switch 12a for recording and reproduction. This amplifier 13 is used for both recording and reproduction, and comprises a voltage-amplifying transistor 14, intermediate amplifying transistor 15, and a power amplifier having a pair of transistors 16a and 16b driven by the transistor 15, input transformer 17 and output transformer 18. A loudspeaker 19 is connected to the output side of the power amplifier 13.

A power source for operating the amplifier 13 comprises a power transformer 20 and a pair of rectifiers 21a and 21b. A D.C. output is smoothed out by a large capacity electrolytic capacitor 22 of 5,000 to 20,000 microfarads, and supplied to the amplifier 13. An input signal is supplied to the voltage-amplifying transistor 14 in the amplifier 13 through a variable resistor 23 and input capacitor 24. A bias resistor 25, emitter resistor 26 and load resistor 27 are connected to the transistor 14. The emitter of transistor 14 is connected to the collector of transistor 15 through a capacitor 28, resistor 29, a second changeover switch 12b and frequency equalizer circuits 30, 31 used in recording and reproduction respectively. The base of transistor 15 is supplied with a signal amplified by the transistor 14 through a coupling capacitor 32, and bias resistors 33 and 34. To the emitter of transistor 15 is connected a parallel circuit of an emitter resistor 35 and high frequency equalization resonance circuit 36. An output signal of the transistor 15 is supplied to the transistors 16a and 16b through the input transformer 17. The emitters of these transistors 16a and 16b are connected to the power source through a common resistor 37. The center tap of the primary winding of the output transformer 18 is grounded. The one end of secondary winding of the output transformer 18 is connected to the recording and reproduction magnetic head 11 through an output circuit 42 for equalizing both recording and reproduction which comprises a parallel circuit of a resistor 38 and capacitor 39 and a parallel circuit of a coil 40 and capacitor 41; and one terminal of recording and reproduction changeover switch 12c in turn.

At the time of recording, the magnetic head 11 is supplied with a high frequency bias signal of, for example 100 kHz. To this end, therefore, there is provided a high frequency bias signal oscillator 46 comprising a pair of transistors 43 and 44 and oscillation transformer 45. The bias signal is applied from part of an output coil 47 through a variable capacitor 48 to the recording and reproduction magnetic head 11. At this time, part of the bias signal is also delivered to an erase head 49.

Power of the high frequency bias signal oscillator 46 is supplied from the D.C. smoothing power source through resistor 50 and a changeover switch 12d in turn, thereby causing the oscillator 46 to be operated only at the time of recording. While recording, an audio signal to be recorded is applied to the input of amplifier 13 through a microphone jack 51 and the changeover switch 12a in turn.

With the magnetic recording and reproduction apparatus of this invention, a nonpolarized low loss capacitor 52 made of, for example, polyethylene terephthalate (known as trade name "Mylar") film is connected in parallel to the large capacity electrolytic capacitor 22 constituting the aforesaid common power source. Further, a polypropylene film capacitor 53 having a smaller capacitance and lower loss than the above-mentioned capacitor 52 is connected in parallel therewith to form a capacitor block 54. The capacitor 52 is chosen to have a capacitance of about 1 to 10 microfarads and the polypropylene film capacitor 53 is chosen to have a capacitance of about 0.1 to 1 microfarads. A better effect is attained by further connecting a styrol capacitor (not shown) having the lowest loss and a capacitance of about 0.01 to 0.1 microfarads in parallel with the capacitors 52 and 53.

A decoupling circuit formed of a resistor 55 and large capacitance electrolytic capacitor 56 is provided for the transistor 14 included in the amplifier 13. Operation power is supplied to the transistor 14 through the decoupling circuit. Further, a Mylar capacitor 57 having a capacitance of about 1 to 10 microfarads, polypropylene capacitor 58 having a capacitance of about 0.1 to 1 microfarads and styrol capacitor (not shown) having a capacitance of about 0.01 to 0.1 microfarads are connected in parallel to the electrolytic capacitor 56 to form a capacitor block 59.

There will now be described by reference to FIG. 2 the operation of the magnetic recording and reproduction apparatus of this invention arranged as mentioned above. In the drawing the changeover switches 12a to 12d are set for recording. A signal supplied to the microphone jack 51 is amplified by the amplifier 13, an output from which is conducted to the magnetic head 11 through the output circuit 42 to be recorded on a running magnetic tape (not shown). A bias signal issued from the bias signal oscillator 46 has its value adjusted through the variable capacitor 48 and then supplied to the magnetic head 11.

When amplified by the amplifier 13, an audio signal delivered from the microphone jack 51 receives noise components due to cross modulation resulting from the nonlinear elements such as resistors and capacitors constituting the coupling circuits of the transistors. The electrolytic capacitors 22, 56 impart large noise components to an amplified signal particularly when the signal circulates through the coupling capacitors 24, 32 and power source. When the noise-bearing amplified signal is mixed with a high frequency bias signal after conducted through the output circuit 42, beat components or tape hiss noises occur over a range from a high frequency to a low frequency by the intermodulation of the high frequency bias signal and noise-bearing amplified signal. With the magnetic recording and reproduction apparatus of this invention, however, the smaller the capacitance of the capacitors constituting the capacitor blocks 54, 59, the more reduced the loss of the capacitors, thus displaying the characteristic that the internal loss of the capacitors block is decreased as the frequency increases. This characteristic is quite different from that of the electrolytic capacitor only whose internal loss progressively increases as the frequency increases. Namely, the Mylar capacitor which has a smaller capacitance than the large capacitance electrolytic capacitor through which low frequency signals mainly pass, and allows the passage of mid-low frequency signals has a far lower internal loss than the electrolytic capacitor, and, therefore, noise occur in smaller amounts at mid-low frequencies than at low frequencies. The mid-high frequency signals mainly pass through the polypropylene film capacitor which has a smaller capacitance and less internal loss than the Mylar capacitor, producing a much smaller amount of noises. With the magnetic recording and reproduction apparatus of this invention, therefore, noises resulting from the capacitors are more considerably decreased over the entire range of audible frequencies than in the prior art.

In audio signal reproduction are generally reproduced sounds of musical instruments containing a larger amount of harmonics than fundamental components. Therefore, the power supply bypass circuit whose internal loss is decreased with increasing frequencies enables harmonics of the musical instruments to be distinctly reproduced without being obstructed by noises. The above-mentioned particular type of power supply circuit reduces beat noises or tape hiss noises which arise when audio signals supplied to a magnetic head are subjected to cross modulation with high frequency bias signals. For example, even with a cassette deck in which the tape is run at the rate of 4.8 cm per second and provided with tracks each of which is about 0.3 mm in width, recording can be carried out with little occurrence of tape hiss noises felt by the ears.

When the changeover switch 12 is thrown toward reproduction, and the magnetic head 11 reproduces recorded signals, noises produced in the reproduction amplifier are decreased beforehand for the same reason as given above, realizing reproduction of extremely high fidelity.

FIG. 3 is a circuit diagram of a high quality magnetic recording and reproduction apparatus according to another embodiment of this invention, in which a recording amplifier, recording magnetic head, reproduction amplifier and reproduction magnetic head are independently provided. An audio signal produced by a microphone 61 is supplied to a recording preamplifier 62. After amplified thereby, the audio signal is delivered to a recording amplifier 64 through a level adjuster 63. A signal amplified by the recording amplifier 64 is supplied to a recording head 69 through an output circuit 68 formed of a coupling electrolytic capacitor 65 and a parallel circuit 68 of resistor 66 and capacitor 67.

The recording amplifier 64 is provided with a tape run-compensating circuit formed of an inductance element 70, selection switch 71, and changeover switch 72 in order to cause the amplifier 64 to represent high frequency range characteristics matching three tape speeds of 4.8 cm/sec., 7.5 cm/sec., and 19 cm/sec.

A high frequency bias signal oscillator 73 is provided for the recording magnetic head 69. This oscillator 73 is supplied with power through a switch 74. A bias signal, together with an audio signal, is conducted to the recording magnetic head 69 through a variable capacitor 75.

At the time of reproduction, signals recorded on a magnetic tape are reproduced by a reproduction magnetic head 76. A reproduced output from the reproduction magnetic head 76 is conducted to a reproduction equalizer amplifier 77 to be amplified. An amplified signal is carried to a line amplifier 80 through a level adjuster 78 and changeover switch 79. The line amplifier 80 amplifies the already amplified signal up to a predetermined output level. A reproduced audio signal thus amplified, is conducted to an output terminal 81. Part of the signal to be recorded is derived fron part of the recording head 69 through a resistor 82. The output level at the output terminal 81 and the signal level applied to the head 69 are selectively monitored by a level meter through a changeover switch 81.

A receiver is inserted into the input side of the recording amplifier 64 always to monitor the recorded condition of audio signals. A compensation circuit comprising a changeover switch 86, resistors 87, 88, 89 and capacitor 90 is connected to the reproduction equalizer amplifier 77 to vary the characteristic of the reproduction equalizer in accordance with the running speed of a magnetic tape.

A power source for recording and reproduction amplifiers are constituted by a power supply transformer 91, rectifiers 92 and 93, a pair of large capacitance electrolytic capacitors 94 and 95 and resistor 96. D.C. voltage is directly impressed on the recording amplifier 64 and line amplifier 80, and also on the reproduction equalizer 77 through a decoupling circuit formed of a resistor 97 and electrolytic capacitor 98, and further on the recording preamplifier 62 through a decoupling circuit comprising a resistor 99 and electrolytic capacitor 100.

The embodiment of FIG. 3 is provided with a capacitor block 104 comprising a nonpolarized low pass polyethylene terephthalate film capacitor 101, a polypropylene film capacitor 102 having a smaller capacitance and lower internal loss than the capacitor 101 and styrol capacitor 103 having a smaller capacitance and far lower internal loss than the capacitor 102 which are connected in parallel with the electrolytic capacitor 95. Therefore, the embodiment of FIG. 3 enables the internal loss of capacitor block to be progressively reduced as the frequency increases. It is advised to set the capacitance of the Mylar capacitor 101 at 1 to 10 microfarads, that of the polypropylene capacitor 102 at 0.1 to 1 microfarads and that of the styrol capacitor 103 at 0.01 to 0.1 microfarads.

With the electrolytic capacitor 98 included in the decoupling circuit, a Mylar capacitor 105, polypropylene capacitor 106 are connected in parallel to form a capacitor block 107. Also with the electrolytic capacitor 100, a Mylar capacitor 108 and polypropylene capacitor 109 are connected in parallel to form a capacitor block 110. The electrolytic capacitor 65 included in the output circuit 68 connected between the recording amplifier 64 and recording magnetic head 69 is also provided with a Mylar capacitor 111 and polypropylene capacitor 112 connected in parallel similarly to form a capacitor block. Since an audio signal amplified by the recording amplifier 64 is supplied to the recording magnetic head 69 at the highest level, the capacitor of the output circuit 68 generates most harmful noises. However, provision of the above-mentioned capacitor block comprising the Mylar capacitor 111 and polypropylene capacitor 112 effectively suppresses noises which might otherwise arise from the electrolytic capacitor of the output circuit 68.

With the embodiment of FIG. 3, amplifiers for recording and reproduction are provided independently and maintained in an optimum operating condition. Yet, it is impossible to overlook harmful effects exerted by noises resulting from passive elements of a circuit, particularly electrolytic capacitors included therein and those caused by beat components or magnetic tape hiss noise occurring due to cross modulation when a high frequency bias signal is supplied to the recording head 69. When therefore, it is attempted to record signals having the level smaller than the lowest recording level, −55dB at a tape speed of 38 cm/sec, then the recording is made impossible due to obstruction by tape hiss noises. However, the embodiment of FIG. 3 which adopts, as described above, a capacitor block comprising nonpolarized capacitors connected in parallel to the electrolytic capacitor has been proved to reduce the lowest recording level down to about −90dB, and enlarge the range of an optimum recording level up to an extent of, for example, from −30dB to several dB as against the previous range of from −10dB to several dB, with the result prominet expansion of a dynamic range.

FIG. 4 shows a practical circuit arrangement of the reproduction equalizer amplifier 77. This amplifier 77 comprises direct-coupled common-emitter transistors 120 and 121. The base of transistor 120 is connected to a base resistor 122 and the emitter of transistor 120 is connected to a resistor 123, one end of which is grounded. The collector of transistor 120 is connected to a load resistor 124, and further to the base of second stage transistor 121. The emitter of transistor 121 is grounded through a resistor 125. The collector of transistor 121 is connected to a load resistor 126 and also to an external output terminal 128 through an electrolytic capacitor 127. A signal conducted to the output terminal 128 is fed back to the emitter of transistor 120 through a changeover switch 129, and equalizer circuit network 130 comprising resistors 131 and 132.

With the reproduction equalizer amplifier 77 of FIG. 4, a capacitor block according to this invention which is formed of an electrolytic capacitor 133, Mylar capacitor 134 and polypropylene capacitor 135 is connected in parallel to the emitter resistor 125. Similarly with the electrolytic capacitor 127 a Mylar capacitor 136 and polypropylene capacitor 137 are connected in parallel to form a capacitor block. The load resistor 124 of transistor 120 is connected to a decoupling circuit formed of a resistor 138 and electrolytic capacitor 139. A Mylar capacitor 140 and polypropylene capacitor 141 are connected in parallel to the electrolytic capacitor 139.

The circuit arrangement of the reproduction equalizer amplifier 77 shown in FIG. 4 fully decreases the occurrence of noises resulting from the nonlinear factor of the passive elements included in the equalizer amplifier 77, thereby noticeably saving the deterioration of sound qualities.

FIG. 5 shows a practical circuit arrangement of the recording amplifier 64 substantially the same as that of FIG. 4. This recording amplifier 64 comprises two direct-coupled emitter-grounded transistors 150 and 151. A recording characteristic compensating circuit 153 is connected between an output terminal 152 and the emitter of transistor 150. Part of the compensation circuit 153 is grounded through an inductance element 154, changeover switch 155 and capacitors 156, 157, 158. A resonance circuit formed of the inductance element 154 and one of the capacitors 156, 157, 158 selected by the changeover switch 155 compensates the high frequency characteristic of the recording amplifier 64. Namely, this recording amplifier 64 has its frequency characteristic shifted by the changeover switch 155 to that which matches the running speed of a magnetic tape.

The recording amplifier 64 of FIG. 5 has the same circuit arrangement as that of FIG. 4. Namely, a capacitor block 159 is connected to the emitter of transistor 151 and a capacitor block 160 is connected to the collector thereof. A capacitor block 161 constituting part of a decoupling circuit is connected to the collector of transistor 150.

The recording preamplifier 62 and line amplifier 80 of FIG. 3 may have the known circuit arrangement, detailed description thereof being omitted.

With the above-mentioned capacitor blocks, nonpolarized capacitors are connected to an electrolytic capacitor. However, a small capacitance and low loss electrolytic capacitor, if available, may be used in place of a nonpolarized capacitor.

what is claimed is:

1. A magnetic recording and reproduction apparatus comprising:
   a recording amplifier for amplifying an audio signal;
   a recording magnetic head for recording an output signal from said recording amplifier on a magnetic tape;
   an output circuit for coupling the output signal of said recording amplifier to said recording magnetic head;
   an oscillator for supplying a high frequency bias signal to said recording magnetic head at the time of the recording;
   a reproduction magnetic head for reproducing a signal recorded on the magnetic tape;
   a reproduction amplifier for amplifying an output signal from said reproduction magnetic head; and
   a power supply circuit for impressing a supply voltage to said recording amplifier; and
   said output circuit provided with a capacitor block comprising means for reducing harmonic distortion, said means comprising a plurality of capacitors connected in parallel and having successively smaller capacitance values, with at least one of the smaller value capacitors being of the lower inner loss type;

whereby the effective internal loss of said block of capacitors is decreased and harmonic distortion reduced.

2. The magnetic recording and reproduction apparatus according to claim 1, wherein said capacitor block comprises a large capacitance electrolytic capacitor and a low internal loss type nonpolarized capacitor having a sufficiently smaller capacitance than said electrolytic capacitor to permit the passage of a signal having a frequency higher than a mid-frequency in the audible frequency range and connected in parallel to said electrolytic capacitor.

3. The magnetic recording and reproduction apparatus according to claim 2 wherein said nonpolarized capacitor is a Mylar capacitor.

4. The magnetic recording and reproduction apparatus according to claim 2 wherein said nonpolarized capacitor is a polypropylene capacitor.

5. The magnetic recording and reproduction apparatus according to claim 2 wherein said nonpolarized capacitor is a styrol capacitor.

6. The magnetic recording and reproduction apparatus according to claim 1, wherein said capacitor block comprises a large capacitance electrolytic capacitor; a first low internal loss type nonpolarized capacitor having a sufficiently smaller capacitance than said electrolytic capacitor to permit the passage of a signal having a mid frequency in the audible frequency range and connected in parallel to said electrolytic capacitor; and a second low internal loss type nonpolarized capacitor having a sufficiently smaller capacitance than said first nonpolarized capacitor to permit the passage of a signal having a high frequency included in the audio frequency range, and less internal loss than said first nonpolarized capacitor and connected in parallel to said electrolytic capacitor.

7. The magnetic recording and reproduction apparatus according to claim 6 wherein said first nonpolarized capacitor is a Mylar capacitor and said second nonpolarized capacitor is a polypropylene capacitor.

8. The magnetic recording and reproduction apparatus according to claim 6 wherein said first nonpolarized capacitor is a Mylar capacitor and said second nonpolarized capacitor is a styrol capacitor.

9. The magnetic recording and reproduction apparatus according to claim 7 further comprising a styrol capacitor having a capacitance value smaller than said first and second nonpolarized capacitors and connected in parallel thereto.

* * * * *